United States Patent
Wang

(10) Patent No.: US 7,414,872 B2
(45) Date of Patent: Aug. 19, 2008

(54) SEGMENTED SEARCH LINE CIRCUIT DEVICE FOR CONTENT ADDRESSABLE MEMORY

(76) Inventor: Jinn-Shyan Wang, Electrical Engineering Department of CCU, 5F-5, 168 San-Hsing, Ming-Hsiung, Chia-Yi (TW)

( * ) Notice: Subject to any disclaimer, the term of this patent is extended or adjusted under 35 U.S.C. 154(b) by 65 days.

(21) Appl. No.: 11/519,089

(22) Filed: Sep. 12, 2006

(65) Prior Publication Data
US 2008/0062804 A1    Mar. 13, 2008

(51) Int. Cl.
G11C 15/00    (2006.01)
G11C 15/04    (2006.01)

(52) U.S. Cl. ............... 365/49.16; 365/49.17; 365/49.1; 711/108

(58) Field of Classification Search .......... 365/49, 365/227, 230.03, 195, 49.1, 49.11, 49.15, 365/49.16, 49.17, 49.18; 711/108
See application file for complete search history.

(56) References Cited

U.S. PATENT DOCUMENTS 4,631,420 A * 12/1986 Hollis et al. ............ 327/201

2003/0123269 A1 * 7/2003 Gillingham et al. ......... 365/49
2005/0185436 A1 * 8/2005 Braceras et al. ............. 365/49

* cited by examiner

Primary Examiner—J. H. Hur
(74) Attorney, Agent, or Firm—Muncy, Geissler, Olds & Lowe, PLLC

(57) ABSTRACT

A segmented search line circuit device for content addressable memory is provided. This device includes a content addressable memory and a segmented unit, wherein the content addressable memory has a plurality of cells arranged in an array and a search line connected between each pair of adjacent cells. Moreover, a first segmented unit is connected between the cells to divide the cells into a plurality of segments to search and between a pair of the adjacent segments to cut off the search lines between the pair of the adjacent segments. Because the circuit of this device is divided into a plurality of segments to search, the circuit of the search line driver need not be modified. As a result, this circuit device can diminish the loading capacitance of the search line driver and reduce the power consumption with the segmented search method.

12 Claims, 6 Drawing Sheets

| 310 | 310 | 310 | ...... | 310 | 310 | 310 | 310 | 500 |
|---|---|---|---|---|---|---|---|---|
| 400 | 400 | 400 | ...... | 400 | 400 | 400 | 400 | |
| 310 | 310 | 310 | ...... | 310 | 310 | 310 | 310 | 500 |

SEGMENTED SEARCH LINE CIRCUIT DEVICE FOR CONTENT ADDRESSABLE MEMORY

BACKGROUND

1. Field of Invention

The present invention relates to a search circuit, and more particularly to a segmented search line circuit device for content addressable memory.

2. Description of Related Art

Low power consumption circuit design plays an important role in the modern integrated circuits. Especially in memory circuit design, decreasing the number of transistors to reduce power consumption is important. As network communications and Internet Protocol version 6 (Ipv6) develops, the performance of the content addressable memory determines the searching speed and power consumption of the network chip. In the research of the content addressable memory, the critical object focuses on improving the performance of the match line and the power consumption to reduce the cost and enhance the efficiency. Recently, the power consumption of the match line has been reduced significantly, so most power consumption is caused by the search line of the content addressable memory.

Reference is made to FIG. 1, wherein the match line is divided into two blocks, a first block 101 and a second block 102, in order to reduce power consumption. The block 102 has a global search driver 103, a local search driver 104, a global search line 105 and a local search line 106. The function of the drivers 103 and 104 controls the search line of the block 102 to determine whether or not the search should continue depending on the match result of the block 101. Because the search activity of the second block 102 is determined by the match result of the first block 101, the local search driver 104 sends the data of the global search driver 105 into the local search line 106 only if just one match result of the first block 101 matches. Contrarily, the local search driver 104 does not send the data of the global search driver 105 into the local search line 106 if all the match results of the first block 101 do not match. Through this method, the power consumption caused by the switching activity can be reduced effectively.

However, the amount of registers and the logic gates (ex: or gate) are increased in this way such that the power consumption is raised and the match line efficiency is relatively deteriorated. Moreover, the match result of this kind of design cannot be produced in a cycle, so the pipelined timing control affects the match line efficiency when the match line is applied to the content addressable memory.

Reference is made to FIG. 2, which illustrates another search line solving power consumption with the charge reuse method. In FIG. 2, the capacitor 203 denotes the loading capacitance of the search line (SBLP and SBLN). The control circuit 201 compares the external data with the search line (SBLP and SBLN) data when the external data is input into the control circuit 201. If the data are different from each other, the control circuit 201 drives the transmission gate 202 to make the potentials of the search line (SBLP and SBLN) become the same. When the potentials of the search line (SBLP and SBLN) become the same, the transmission gate 202 shuts down and the control circuit 201 sends the data into the search line (SBLP and SBLN). Through this method of charge sharing, wasted charges caused by charging/discharging of the search line (SBLP and SBLN) are diminished to reduce power consumption. However, this method reduces the power consumption for search lines, but the loading capacitance ($C_{LP}$ and $C_{LN}$) of the capacitors 203 in the search line is very large. Therefore, the extra control circuit 201 is demanded and consumes extra so that the power consumption of the entire system cannot be reduced. Consequently, although adding the control circuits can reduce the power consumption of the search lines, this method also generates additional power consumption and even affects the efficiency of the match line.

SUMMARY

It is therefore an objective of the present invention to provide a segmented search line circuit device for content addressable memory to reduce the power consumption of the search line, improve the shortcomings of the pipelining method in the match line, which increases the usage of an amount of registers and extra logic gates, and improves the timing control such that the pipelining is not needed.

It is another objective of the present invention to provide a segmented search line circuit device for content addressable memory to reduce the power consumption of the match line, and improve the shortages of the charge reuse method, which results in additional power consumption caused by the control circuit and deteriorates the efficiency of the match line.

A segmented search line circuit device in accordance with the present invention for content addressable memory is provided. This device adds segment units to divide the search line into many segments, and has auto-detect functions without modifying the circuit of the search line driver.

A content addressable memory includes a plurality of cells arranged in an array, and a search line connected between each pair of the adjacent cells. Besides, a first segmented unit is connected between the cells to cut off the search line to divide the cells into two segments in order to do segmented searches. The content addressable memory with the pipelining method in accordance with the prior art increases the amount of registers and logic gates and the search operation cannot be produced in a cycle. Besides, the content addressable memory with the charge reuse method in accordance with the prior art results in additional power consumption produced by the control circuit and affects the efficiency of the match line. As a result, the content addressable memory uses a segmented search and auto-detect method instead of modifying the circuit of the search line driver such that the timing control and additional power consumption problems are improved.

The segmented units have a first segmented unit and a second segmented unit, and these two segmented units divides the cells into three segments. Each of the segmented unit has a switch circuit and a memory circuit. The memory circuit affects the switch of the segmented unit. When the stored data of the memory circuit is "0", the switch circuit of the segmented unit is opened to set the search line in low level. Therefore, the search line driver does not drive this segment to do charging/discharging activity such that the switching of the search line can be diminished and the power consumption of the search line can be reduced.

The memory circuit has a storage function, so the memory circuit can memorize the cell data in the segmented unit whether it is "don't care" or not. If the writing data is "don't care", the writing lines (WBLP and WBLN) are both high level. Therefore, the data "0" is stored in the memory circuit and the switch circuit of the segmented unit is opened such that the data in the search line cannot access. Contrarily, if the writing data is "care", one of the writing lines (WBLP and WBLN) is high level and another is low level. Thus, the data "1" is stored in the memory circuit and the switch circuit of the segmented unit is closed such that the data in the search line can access. As a result, the memory circuit of the segmented unit can be automatically adjusted to open or close depending on the stored data in the content addressable memory to optimize the power consumption of the search line.

The segmented search line circuit device for content addressable memory of the present invention provides many advantages:

1. This device uses a segmented search and an auto-detect method instead of modifying the circuit of the search line driver such that the additional power consumption problem can be improved.

2. This device uses a segmented unit to shut down the partial segment such that the loading capacitance of the search line driver is reduced and the power consumption can also be reduced.

Moreover, because of the lower power consumption, higher searching speed of segmented search line circuit device for the content addressable memory, the performances of the applications, such as the router, the hardware searching engine and the template matcher, are enhanced to boost the utility.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
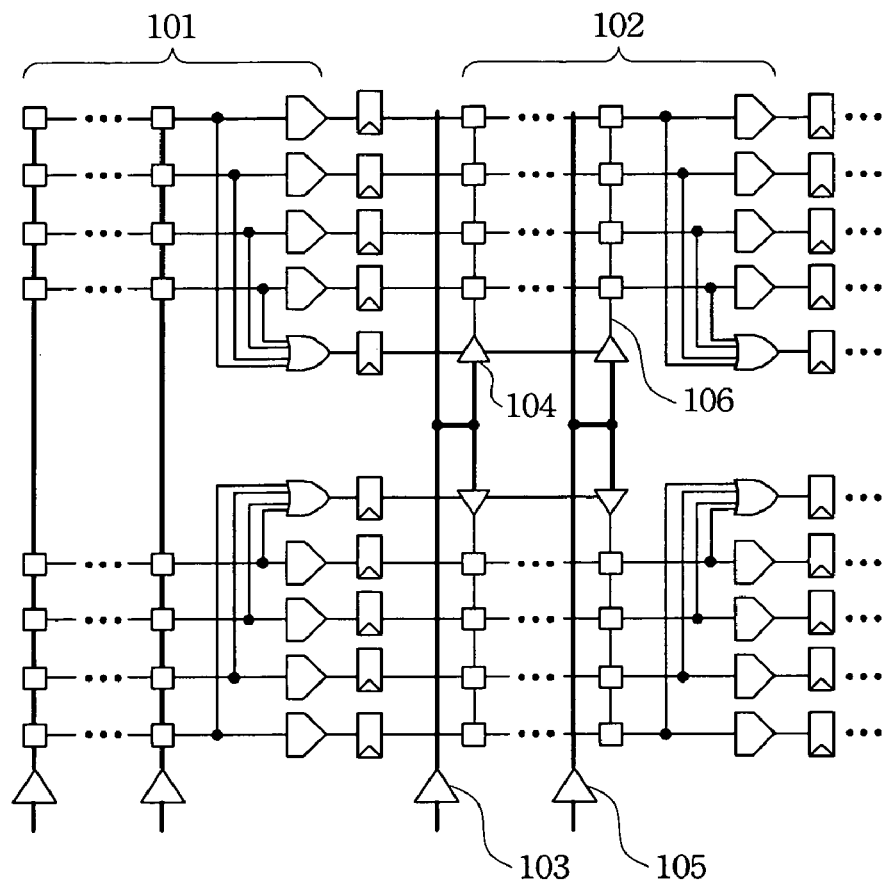
FIG. 1 illustrates a search circuit diagram with pipelining the match line for content addressable memory in accordance with the prior art.
Figure 2:
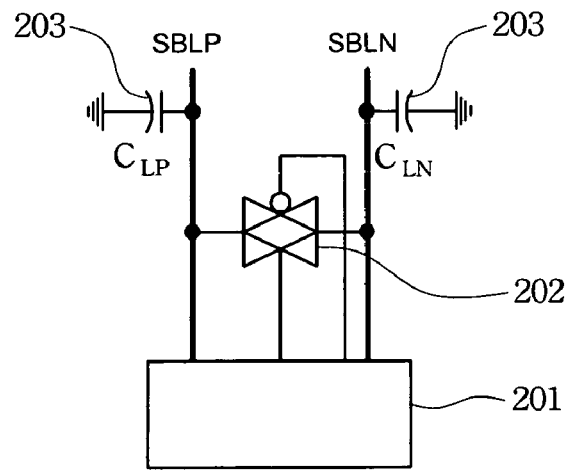
FIG. 2 illustrates a search circuit diagram with the charges for content addressable memory in accordance with the prior art.

Reference will now be made in detail to the present preferred embodiments of the invention, examples of which are illustrated in the accompanying drawings. Wherever possible, the same reference numbers are used in the drawings and the description to refer to the same or like parts.

While the specification concludes with claims defining the features of the invention that are regarded as novel, it is believed that the invention will be better understood from a consideration of the following description in conjunction with the figures, in which like reference numerals are carried forward.

Figure 3:
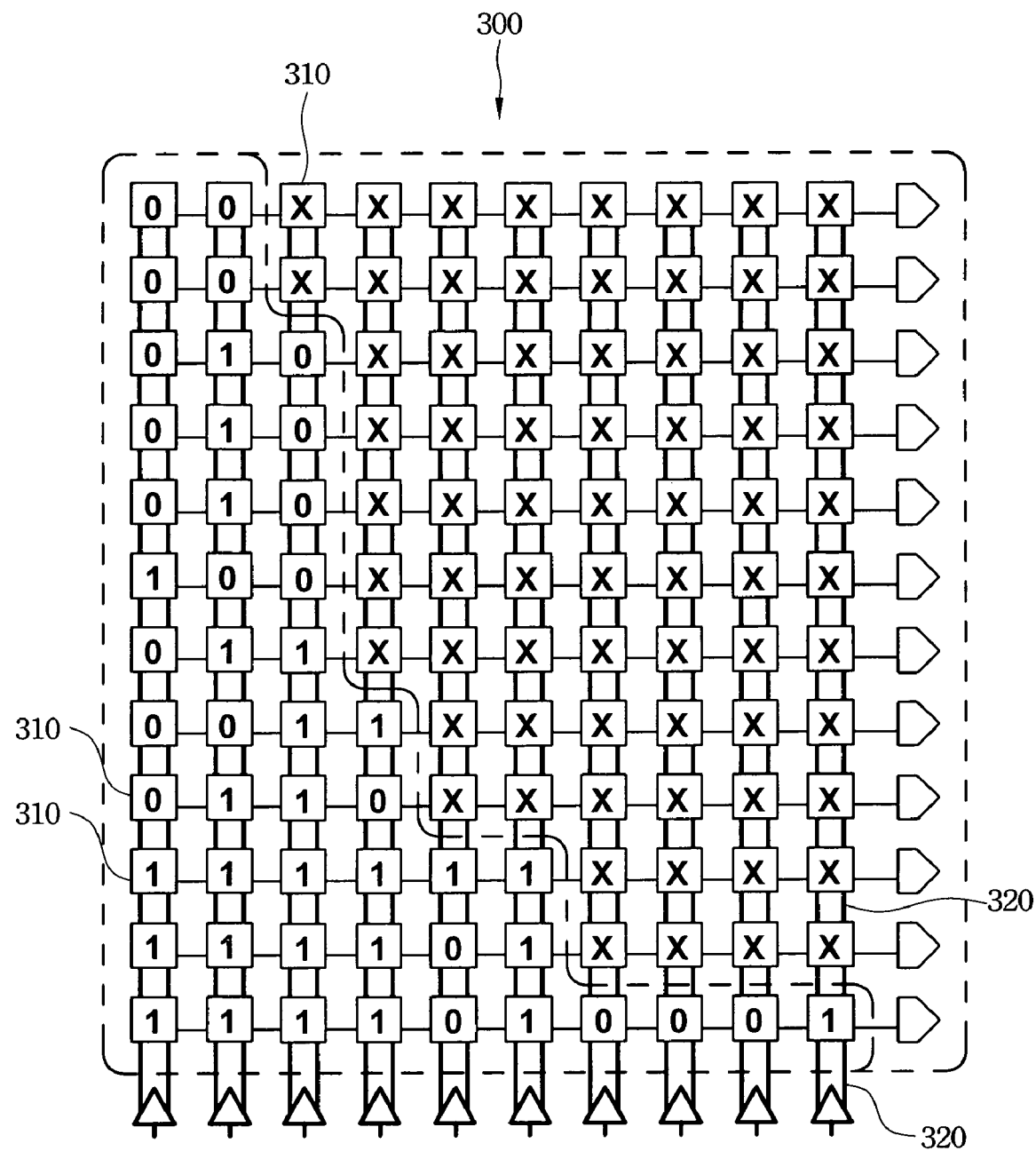
FIG. 3 illustrates a layout diagram of the non-segmented search line circuit device for content addressable memory of the preferred embodiment of the present invention.
Figure 4:
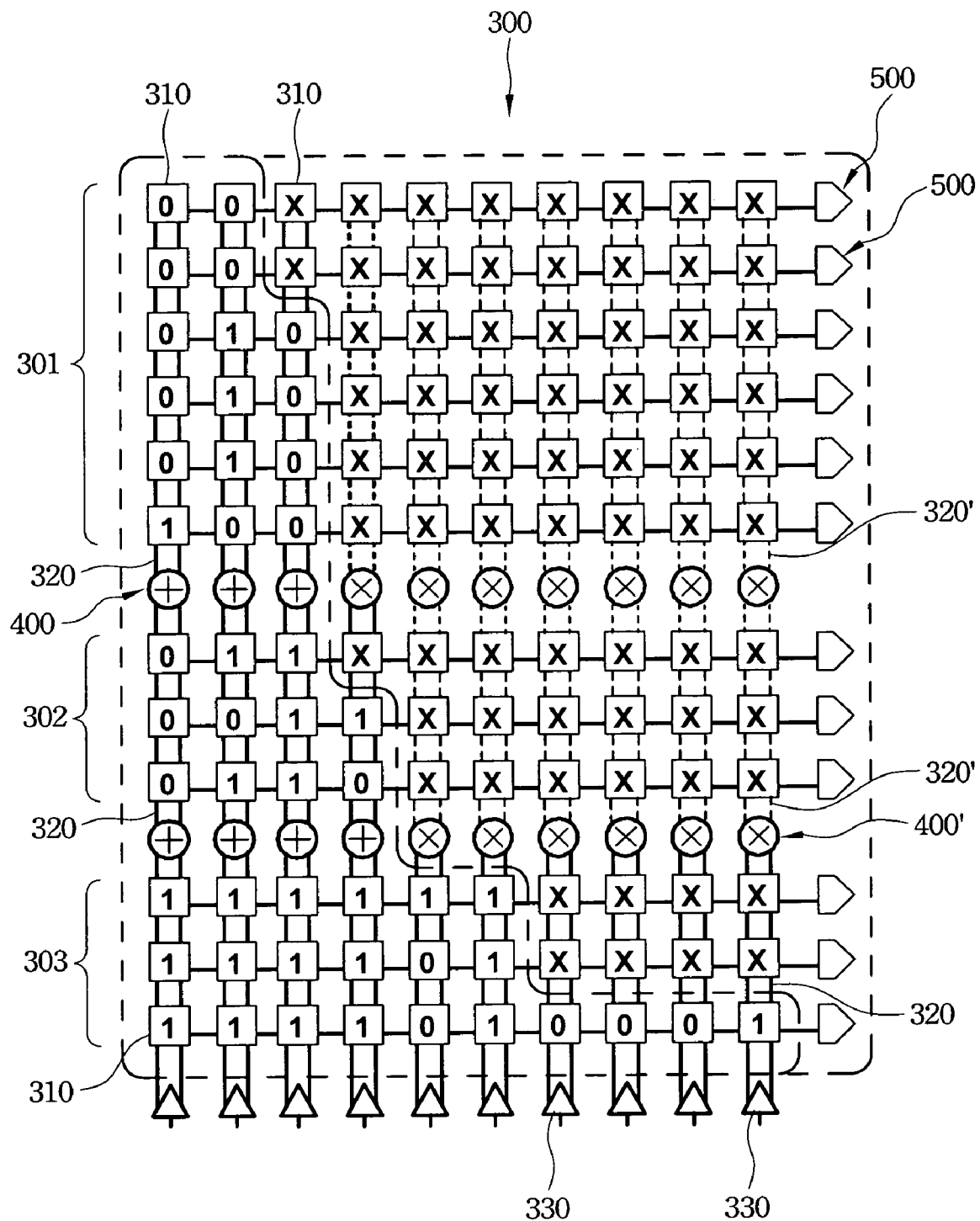
FIG. 4 illustrates a segmented unit layout diagram of the preferred embodiment of the present invention in FIG. 3.

Reference is made to FIG. 3 and FIG. 4, wherein FIG. 3 illustrates a layout diagram of the non-segmented search line circuit device for content addressable memory, and FIG. 4 illustrates a segmented unit layout diagram of the preferred embodiment of the present invention.

The segmented search line circuit device for content addressable memory of the embodiment of the present invention includes a content addressable memory 300, a first segmented unit 400 with two kinds of signal groups between segment 301 and segment 302 and a match line 500. The match line 500 is conventional and can be recognized by the person skilled in the art without detail description in the following.

The content addressable memory 300 has a plurality of cells 310, a search lines 320 connected between each pair of adjacent cells 310 and a search driving unit including a plurality of search line drivers 330.

The cells 310 are arranged in an array, and the data stored in the cells 310 are divided into three conditions, "0" (Low), "1" (High) and "X" (Don't care). The cells 310 storing "X" are not compared with the data of the search line 320, so the data of the search line 320 does not affect the cells 310 storing "X". Through this method, the segmented search line circuit device uses the segmented search lines 320 to reduce the loading capacitance of the search line driver 330.

Reference is made to FIG. 4, the segmented unit 400 is connected with the cells 310 to respectively cut off the search lines 320 and divides the cells 310 into a plurality of segments to search. In this embodiment, the content addressable memory 300 has a first segmented unit 400 and a second segmented unit 400' that divide the cells 310 into three segments, a first segment 301, a second segment 302 and a third segment 303. The first segmented units 400, the second segmented unit 400' and the cells 310 are set in the form of an array wherein the first segmented units 400 and the second segmented unit 400' includes two signal groups consisting of the "⊕" symbols and the "⊗" symbols.

The second segment unit 400' includes a switch (switch circuit 420 in FIG. 5, and this is described in more detail later). The switch is controlled by the cells 310. If the stored data of the cells 310 of the second segmented unit 400' are "X" (Don't care), the data will not be sent into the search line 320' of the upper segment. The switches of the second segmented unit 400' are open (⊗). Contrarily, If the stored data of the cells 310 of the second segmented unit 400' are not "X" (Don't care), thus, the "0" and "1" need to be sent into the search line 320' of the upper segments. The switches of the second segmented unit 400' are closed (⊕). When the switches of the second segmented unit 400' are open, the data of the search lines 320 cannot be sent into the upper search lines 320'. Because the segments with charging/discharging requirement by the search line drivers 330 are diminished, the power consumption of the search line is reduced.

Figure 5:
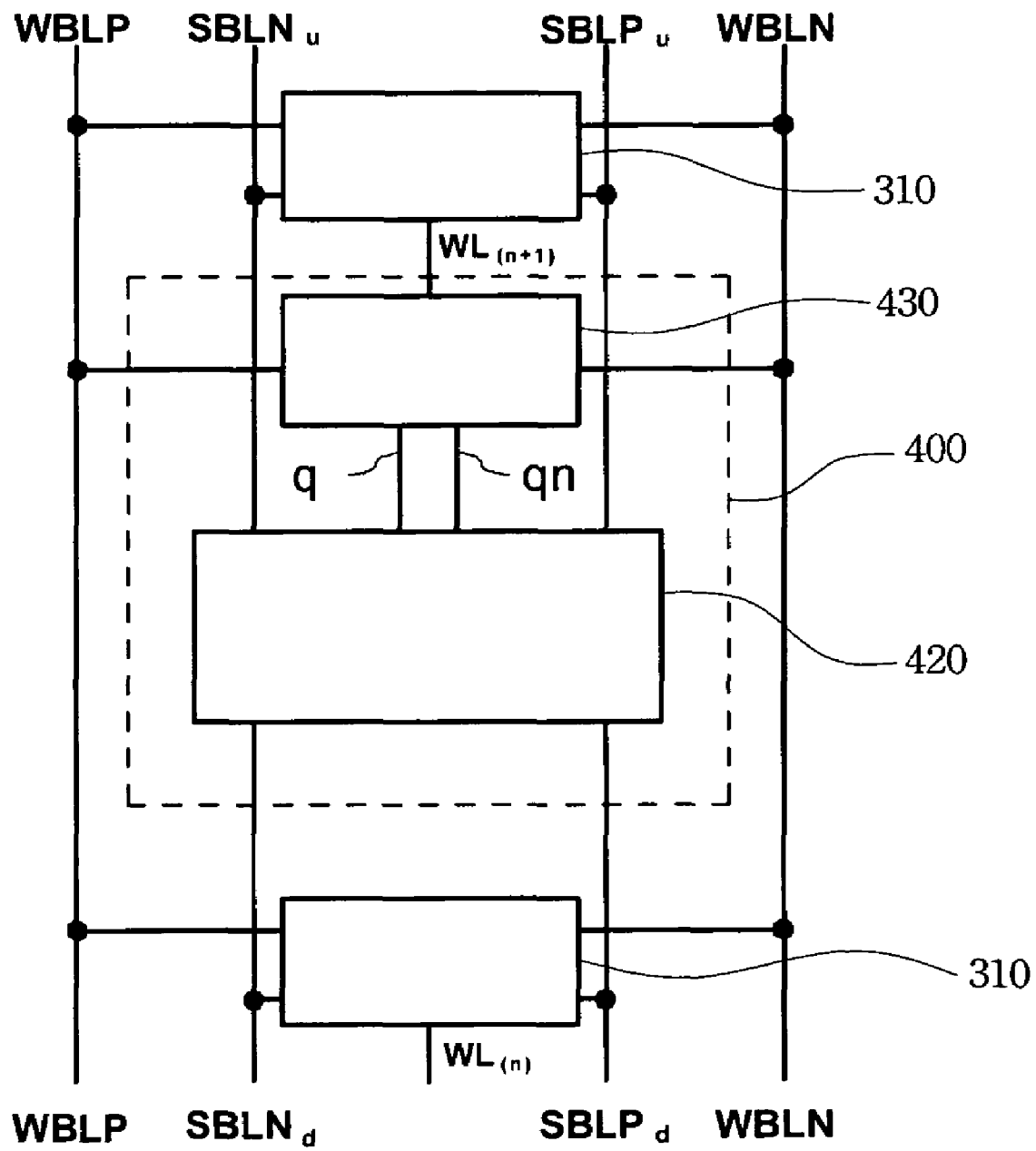
FIG. 5 illustrates a block diagram of the segmented unit of the preferred embodiment of the present invention.

Reference is made to FIG. 5, which illustrates a block diagram of the segmented unit in FIG. 4. The first segmented unit 400 includes a switch circuit 420 and a memory circuit 430.

Figure 6:
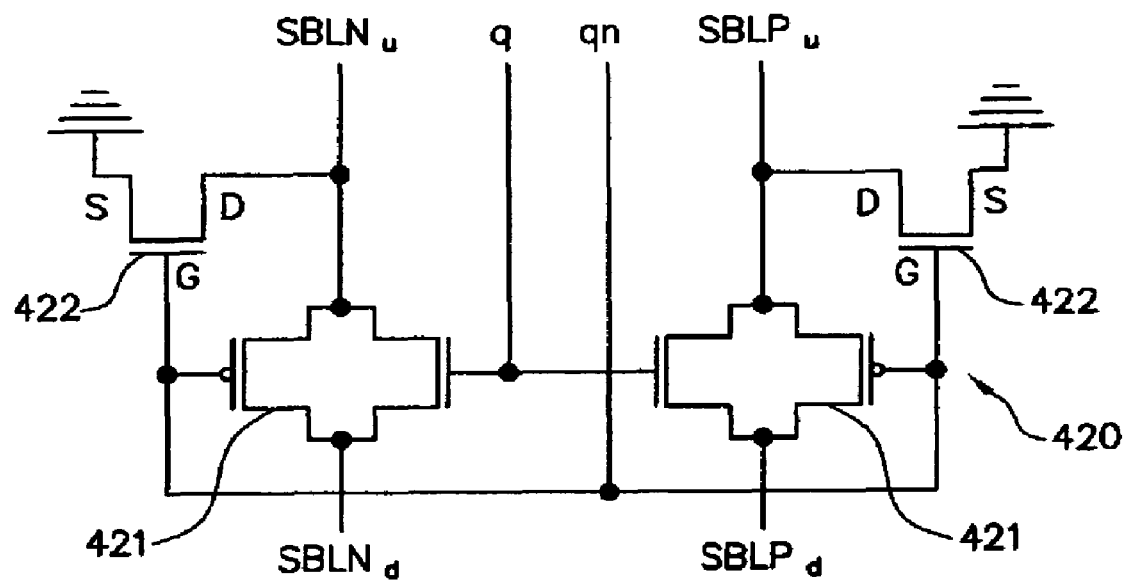
FIG. 6 illustrates a switch circuit diagram in FIG. 5.

Reference is made to FIG. 6, which illustrates the switch circuit diagram in FIG. 5. The switch circuit 420 includes two transmission gates 421 and two N-type transistors 422 wherein the N-type transistor 422 is N-type metal-oxide-semiconductor (NMOS). The gate G and the drain D of each N-type transistor 422 are individually connected with the transmission gates 421, and the source S of each N-type transistor 422 is grounded.

Figure 7:
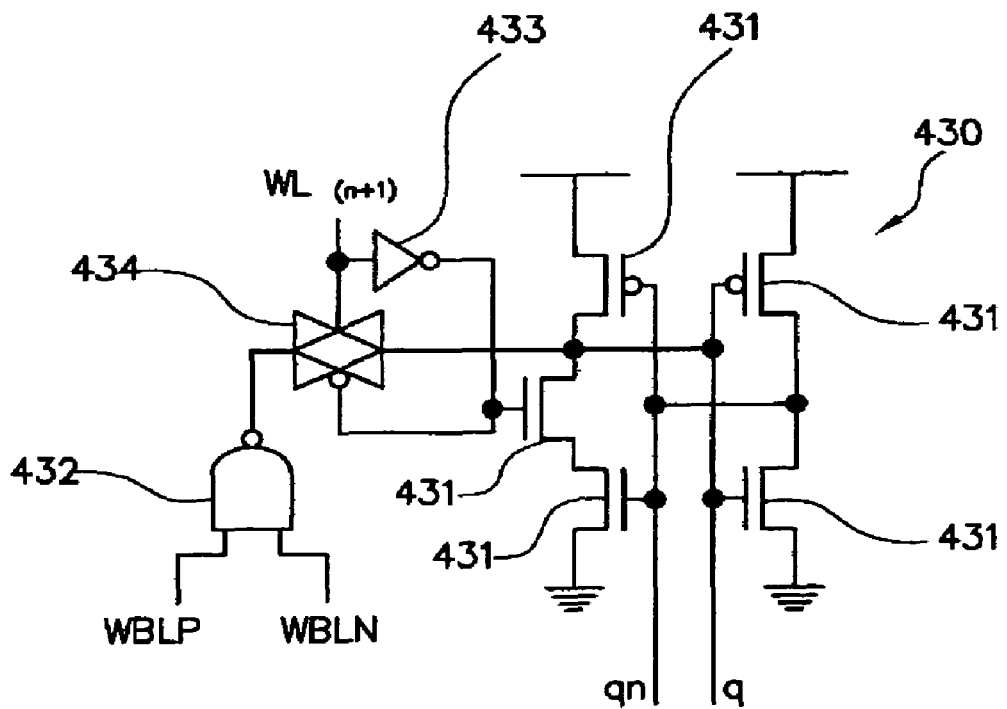
FIG. 7 illustrates a memory circuit diagram in FIG. 5.

Reference is made to FIG. 7, which illustrates the memory circuit diagram in FIG. 5. The memory circuit 430 includes five transistors 431, a logic gate 432, an inverter 433 and a transmission gate 434 wherein the transistors 431 are field-effect transistors and the logic gate 432 is a NAND gate.

Reference is made to FIG. 4, FIG. 5, FIG. 6 and FIG. 7. In the switch circuit 420, the q and qn signals are complementary. When the q signal is in low level, the transmission gate 421 of the switch circuit 420 is opened, and the connected search lines ($SBLP_u$ and $SBLN_u$) of the switch circuit 420 are set in low level by the transistors 422. Thus, the search lines 320' in the segments 301,302 in FIG. 4 are shut down and the search line driver 330 does not charge or discharge the search lines 320' in the segments 301,302. As a result, the loading capacitance of the search line driver 330 is lowered and the power consumption is relatively reduced.

Reference is made to FIG. 4, FIG. 5, FIG. 6 and FIG. 7. When the q signal is in high level, the transmission gates 421 of the switch circuit 420 are closed, and the external data can be sent to the search line 320 for matching operations with the cells 310. Moreover, the switch circuit 420 is controlled by the memory circuit 430, and the memory circuit 430 has a storage function to memorize the data of the upper cells 310 in FIG. 4 that whether they are "X" or not. When the content addressable memory (CAM) performs writing, the write-in bit lines (WBLP and WBLN) are both in high level if the wrote-in data of the cells 310 are "X" (Don't care). Thus, the data will be written into the memory circuit 430, and the q signal of the memory circuit 430 is in low level. Therefore, the transmission gates 421 of the switch circuit 420 are opened such that the data of the search line 320' cannot be passed through. Contrarily, if the wrote-in data of the cells 310 are not "X" (Don't care), the q signal of the memory circuit 430 is in high level. Therefore, the transmission gates 421 of the switch circuit 420 are closed such that the data of the search line 320 can be passed through.

Through the segmented search line circuit of the present invention, the loading of the search line driver 330 can be reduced. Besides, the segmented units 400 and 400' can automatically adjust the switch circuit 420 depending on the stored data of the content addressable memory to diminish the power consumption of the search line 320'. Moreover, the circuit of the search line driver 330 in this device need not be modified, so this kind of circuit is easy to implement.

Figures 8, 9:
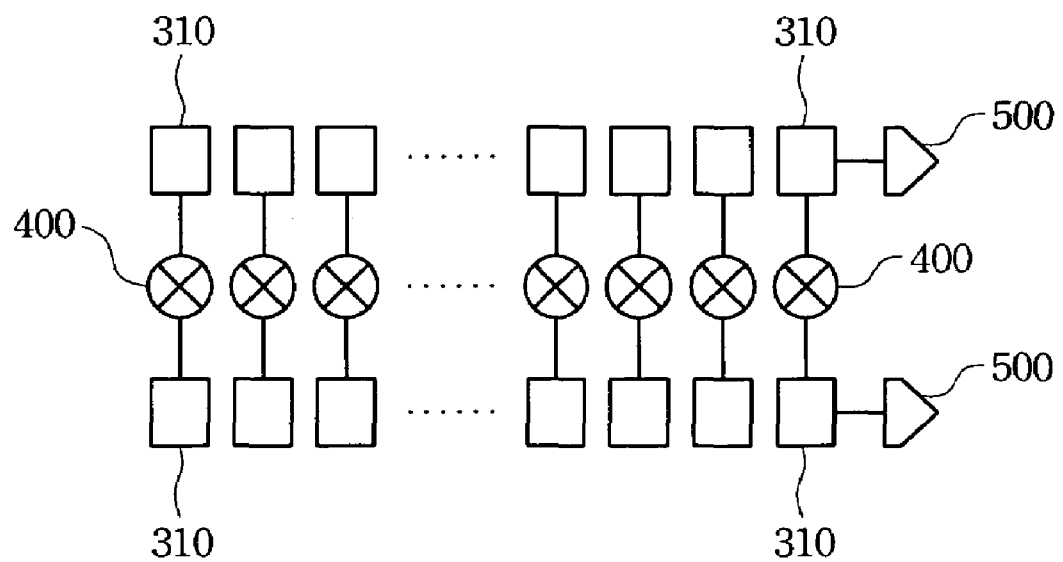
FIG. 8 illustrates partial circuit diagram in FIG. 4.
FIG. 9 illustrates an abutting configuration diagram applied in the circuit layout in accordance with FIG. 8.

Reference is made to FIG. 8 and FIG. 9, wherein FIG. 8 illustrates a partial circuit diagram in FIG. 4, and FIG. 9 illustrates an abutting configuration diagram applied in the circuit layout in accordance with FIG. 8. Because the sizes of the segmented unit 400, the cells 310 and the match line 500 are the same, a circuit layout with the abutting configuration can be applied in the memory.

Although the present invention has been described in considerable detail with reference to certain preferred embodiments thereof, other embodiments are possible. Therefore, their spirit and scope of the appended claims should no be limited to the description of the preferred embodiments container herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A segmented search line circuit device for a content addressable memory including a plurality of cells arranged in an array, and a search line connected between each pair of adjacent cells, and the segmented search line circuit device comprising:
   a first segmented unit, connected between the cells to divide the cells into a plurality of segments to search, and comprising a switch circuit and a memory circuit wherein the switch circuit is controlled by the memory circuit;
   wherein the first segmented unit is connected between a pair of the adjacent segments to cut off the search lines between the pair of the adjacent segments.

2. The segmented search line circuit device for content addressable memory of claim 1, wherein the switch circuit includes a transmission gate and a N-type transistor.

3. The segmented search line circuit device for content addressable memory of claim 2, wherein the N-type transistor is a N-type metal-oxide-semiconductor (NMOS).

4. The segmented search line circuit device for content addressable memory of claim 3, wherein the N-type metal-oxide-semiconductor (NMOS) is grounded.

5. The segmented search line circuit device for content addressable memory of claim 1, further comprising a second segmented unit, wherein the segments divided by the two segmented units are a first segment, a second segment, and a third segment.

6. The segmented search line circuit device for content addressable memory of claim 5, wherein the two segmented units and the cells are arranged in an array.

7. The segmented search line circuit device for content addressable memory of claim 6, wherein the two segmented units and the cells are arranged in a layout with an abutting configuration.

8. The segmented search line circuit device for content addressable memory of claim 1, wherein the memory circuit includes five transistors, a logic gate, an inverter and a transmission gate.

9. The segmented search line circuit device for content addressable memory of claim 8, wherein the five transistors are metal-oxide-semiconductors (MOS).

10. The segmented search line circuit device for content addressable memory of claim 8, wherein the logic gate is a NAND gate.

11. The segmented search line circuit device for content addressable memory of claim 1, wherein the content addressable memory further includes a search driving unit connected with the cells.

12. The segmented search line circuit device for content addressable memory of claim 11, wherein the search driving unit includes a plurality of search line drivers.

* * * * *